(12) United States Patent
Chen et al.

(10) Patent No.: US 8,996,084 B2
(45) Date of Patent: Mar. 31, 2015

(54) SUPERCONDUCTING MAGNET DEVICE AND MAGNETIC RESONANCE IMAGING SYSTEM

(75) Inventors: Xian Zi Chen, Shenzhen (CN); An Feng Li, Shenzhen (CN); Xing En Yu, Shenzhen (CN)

(73) Assignee: Siemens PLC, Camberley (GB)

( * ) Notice: Subject to any disclaimer, the term of this patent is extended or adjusted under 35 U.S.C. 154(b) by 46 days.

(21) Appl. No.: 13/541,222

(22) Filed: Jul. 3, 2012
(Under 37 CFR 1.47)

(65) Prior Publication Data
US 2013/0190186 A1 Jul. 25, 2013

(30) Foreign Application Priority Data

Jul. 6, 2011 (CN) .......................... 2011 1 0188096

(51) Int. Cl.
| | | |
|---|---|---|
| *H01B 12/00* | (2006.01) | |
| *H01F 6/06* | (2006.01) | |
| *G01R 33/3815* | (2006.01) | |
| *G01R 33/28* | (2006.01) | |

(52) U.S. Cl.
CPC .............. *H01F 6/06* (2013.01); *G01R 33/3815* (2013.01); *G01R 33/288* (2013.01)

USPC ......................................................... 505/211

(58) Field of Classification Search
CPC .............................. H01F 6/06; G01R 33/3815
USPC ......................................................... 505/211
See application file for complete search history.

(56) References Cited

U.S. PATENT DOCUMENTS

| | | | |
|---|---|---|---|
| 3,801,942 A * | 4/1974 | Elsel | 335/216 |
| 5,956,957 A | 9/1999 | Lowry et al. | |
| 2009/0128270 A1* | 5/2009 | Calvert et al. | 335/216 |
| 2010/0271024 A1* | 10/2010 | Aubert | 324/309 |
| 2011/0253407 A1 | 10/2011 | Akhmetov | |

FOREIGN PATENT DOCUMENTS

| | | |
|---|---|---|
| CN | 101075495 | 11/2007 |
| GB | 2 254 409 | 1/1992 |
| JP | 6308174 | 11/1994 |
| JP | 07051246 | 2/1995 |
| JP | 11214214 | 8/1999 |
| SU | 765607 | 9/1980 |

* cited by examiner

*Primary Examiner* — Paul Wartalowicz
(74) *Attorney, Agent, or Firm* — Schiff Hardin LLP

(57) ABSTRACT

A superconducting magnet device and a magnetic resonance imaging system not only avoid the need for costly aluminum alloy formers but also lower quench pressure effectively, have a baffle covering the former and the coil, with a gap between the baffle and the coil.

13 Claims, 3 Drawing Sheets

SUPERCONDUCTING MAGNET DEVICE AND MAGNETIC RESONANCE IMAGING SYSTEM

BACKGROUND OF THE INVENTION

1. Field of the Invention

The present invention relates to the field of magnetic resonance imaging (MRI) equipment, and in particular to a superconducting magnet device and a magnetic resonance imaging system comprising the same.

2. Description of the Prior Art

The superconducting magnet device in a magnetic resonance system requires a refrigerant—for example, liquid helium—to cool the superconducting coils to a temperature lower than the critical point. To this end, when such a superconducting magnet device is being manufactured, the superconducting wire must be dry-wound or wet-wound on a former. In general, multiple coils must be wound to maintain a steady homogeneous field strength. The coil(s) formed by winding is/are impregnated with epoxy resin in a vacuum chamber, the coil(s) is/are then placed in a low-temperature vessel in the vacuum chamber, and refrigerant is injected into the low-temperature vessel so that the coil(s) is/are immersed in the refrigerant.

FIG. 1 is a structural diagram of an existing superconducting magnet device; this superconducting magnet device adopts a structure which is currently in widespread use, having inner-layer and outer-layer coils and formers. A plurality of inner-layer coils 4 are wound on an inner-layer former 1, a plurality of outer-layer coils 3 are wound on an outer-layer former 2; a frame 5 is located between the inner-layer former 1 and the outer-layer former 2, the purpose thereof being to assemble the two formers and support the outer-layer former 2 such that this is fixed relative to the inner-layer former 1.

When a quench occurs in a superconducting coil during production or operation of a superconducting magnet device, Joule heating arising from the current in the superconducting wire and the eddy currents induced in the former and/or low-temperature vessel will cause the refrigerant surrounding the superconducting coil to rapidly boil and vaporize, in which case the volume of the refrigerant expands sharply. Since the low-temperature vessel's ability to discharge gas in a short period of time is limited, the pressure in the low-temperature vessel (hereinafter referred to as the "quench pressure") will at this point rise rapidly.

Obviously, an excessively high quench pressure presents a serious risk to the safety of the low-temperature vessel and even the reliability of the superconducting magnet device. The following three solutions have already been proposed in the prior art for the elimination of this risk:

1) Reinforcement of the low-temperature vessel, so that it is able to withstand a higher quench pressure. The disadvantage of this solution is that it increases costs, because more stainless steel or aluminium alloy material is generally needed to reinforce the structure of the low-temperature vessel.

2) Increasing the size of the exhaust channel and exhaust port. The disadvantage of this solution is that the dimensions of the exhaust channel and exhaust port are limited by the installation space, and blindly increasing the size of the exhaust channel and exhaust port (especially when a relatively large neck tube design is used in the superconducting magnet device) will increase the additional heat load of the low-temperature vessel.

3) Making the formers from an aluminium alloy with lower resistivity and thermal conductivity. This solution is capable of lowering the quench pressure effectively, but the cost of using such an aluminium alloy is relatively high.

SUMMARY OF THE INVENTION

In view of this, the present invention provides a superconducting magnet device which not only avoids the need for costly aluminium alloy formers but can also lower the quench pressure effectively.

The invention accordingly provides superconducting magnet devices and magnetic resonance imaging systems as defined in the appended claims.

According to the present invention, a superconducting magnet device comprises: a first former, a first coil formed by a superconducting wire wound on the first former, and a baffle covering the first former and the first coil, wherein there is a gap between the baffle and the first coil.

When a quench occurs in the first coil, the baffle helps to slow down the diffusion of heat from the first coil into the refrigerant, thereby lowering the quench pressure.

The superconducting magnet device can further comprise: a second former covering outside the first former and the first coil; a second coil formed by a superconducting wire wound on the second former; a frame between the first former and the second former, for supporting the second former and making the second former fixed relative to the first former. The frame can connect the first former and the second former by bolts; the first former and the second former can be made from aluminium 5083 or aluminium AC4A.

Preferably, the superconducting magnet device can further comprise: a baffle covering the second former and the second coil, wherein there is a gap between the baffle and the second coil.

If the inner-layer and outer-layer coils and formers are covered by baffles, the quench pressure can be lowered further.

Preferably, the baffle is set with multiple holes. The multiple holes can be distributed on the baffle uniformly.

In a non-quench state, the holes on the baffle help to maintain normal circulation of liquid and gas on the two sides of the baffle, while in a quench state, the dimensions of the holes can limit the speed at which heat from inside the baffle diffuses into the liquid outside the baffle.

The baffle can be a plate made from non-metallic material. Preferably, the non-metallic material is glass fibre reinforced plastics.

As stated above, using a material with low thermal conductivity helps to lower the quench pressure.

The frame connects the first former and the second former through bolts, welding, screws or rivets.

The first former and the second former are made from aluminium 5083 or aluminium AC4A or a similar aluminium alloy.

In addition, the present invention provides a magnetic resonance imaging system comprising the superconducting magnet device as described above.

In summary, the technical solution provided by the embodiments of the present invention lowers the quench pressure effectively, and improves the reliability of the superconducting magnet device; moreover, there is no need to select a material with a lower thermal conductivity for the formers, or a more sturdy low-temperature vessel, thus the cost of materials for the formers and low-temperature vessel is reduced.

DESCRIPTION OF THE PREFERRED EMBODIMENTS

In order to explain the object of the invention, technical solution and advantages of the present invention, it will be described in further detail below with reference to embodiments and accompanying drawings.

It was mentioned previously that by making the formers from an aluminium alloy with lower resistivity and thermal conductivity, the quench pressure could be lowered effectively. With this in mind, in the embodiments of the present invention, quench testing was first carried out using superconducting magnet devices with two typical types of former: respectively aluminium 5083 (AL 5083) formers and aluminium AC4A (AL AC4A) formers. Of these, in terms of low-temperature physical performance, aluminium 5083 has lower resistivity and thermal conductivity, but the cost of using aluminium 5083 is higher at the present time.

Figure 2:
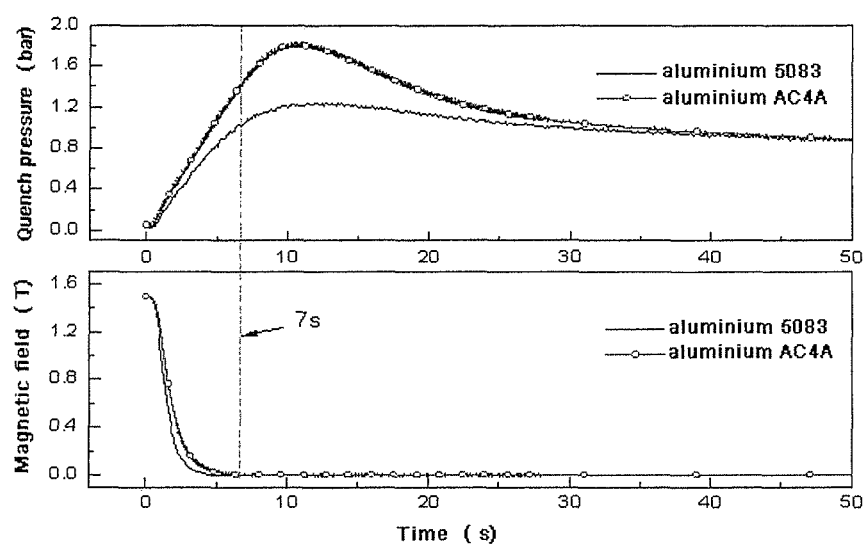
FIG. 2 is plots of the change in quench pressure and magnetic field attenuation with time when a quench occurs in superconducting magnets employing different former materials.

As FIG. 2 shows, the results of quench testing show that magnetic field attenuation is faster and quench pressure lower in a superconducting magnet using aluminium 5083 formers. Specifically, the peak quench pressure for an aluminium 5083 former is lower by 0.5 bar than that for an aluminium AC4A former. In addition, it can be seen from the plots in FIG. 2 that for superconducting magnets using formers of these two materials, decay of the magnetic field takes about 7 seconds, while the peak pressure occurs at 10-12 seconds. This shows that the lower the rate of heat conduction from the coil and former to the refrigerant, the more slowly the liquid will boil and vaporize and hence the lower the peak quench pressure. Thus, using a material with low thermal conductivity helps to lower the peak quench pressure of the low-temperature vessel. At the same time, an increase in the heat absorbed by the coil and former is also beneficial in lowering the peak quench pressure.

On this basis, the present invention proposes a superconducting magnet device which not only avoids the need for costly aluminium alloy formers but also lowers the quench pressure effectively, and comprises: a former; a coil formed by a superconducting wire wound on the former; and a baffle covering the former and the coil, wherein there is a gap between the baffle and the coil.

Figure 1:
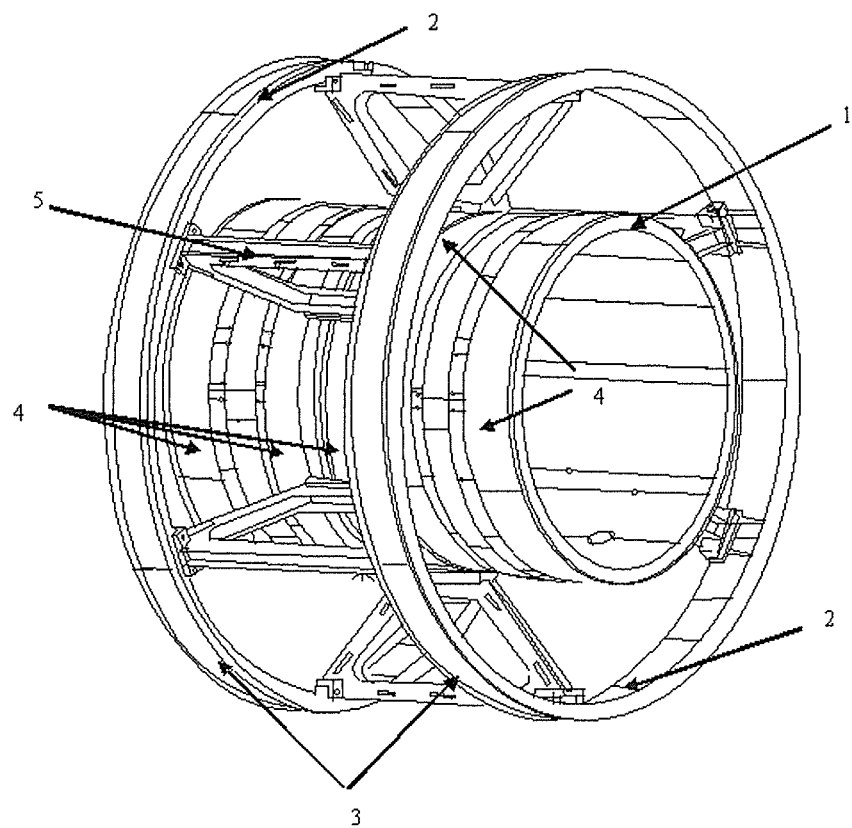
FIG. 1 is a structural diagram of an existing superconducting magnet device.
Figure 3:
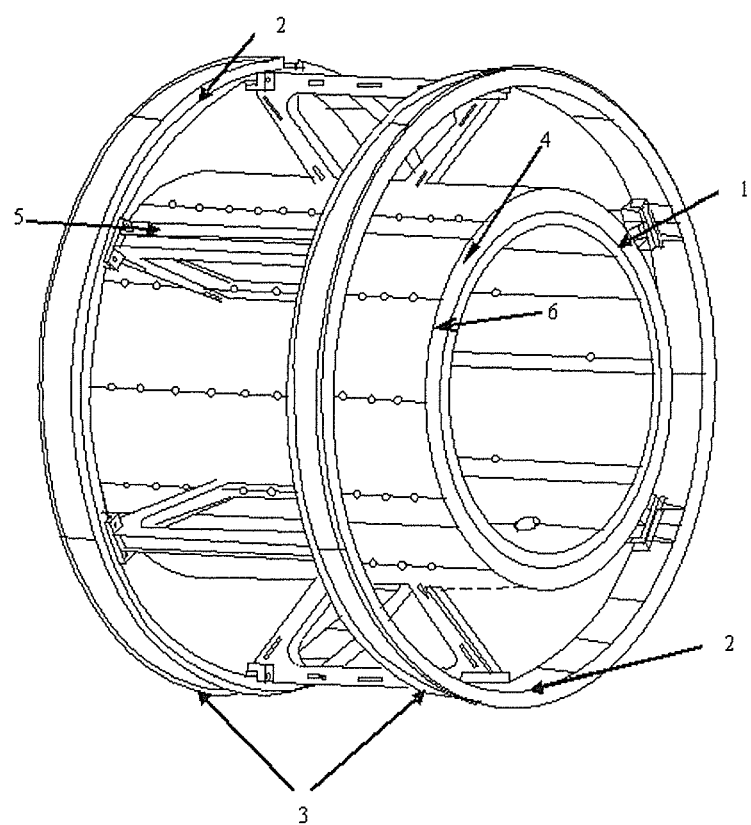
FIG. 3 is a structural diagram of the superconducting magnet device provided by an embodiment of the present invention.

FIG. 3 is a structural diagram of the superconducting magnet device provided by an embodiment of the present invention. This superconducting magnet also employs a structure of coils and formers on both inner and outer sides; the frame thereof is essentially the same as that of the existing superconducting magnet device shown in FIG. 1, the main difference being that this superconducting magnet device also comprises a baffle 6.

As FIG. 3 shows, the baffle 6 covers the inner-layer former 1 and the inner-layer coil 4, with a small gap between it and the inner-layer coil 4. During mounting, the baffle 6 can be fixed on the frame 5, or be fixed using another component. The baffle 6 can be made from a plate of non-metallic material with low thermal conductivity, for example from glass fibre reinforced plastics (GRP).

As FIG. 3 shows, the baffle 6 can be set with holes; this is beneficial in allowing the liquid and gas flow to maintain a normal temperature environment in a non-quench state. In a quench state, gas in the gap between the baffle 6 and the inner-layer former 1 will not pass through these holes rapidly in a short space of time, since it is restricted by the dimensions of the holes; correspondingly, liquid does not easily pass through these holes into the gap to contact the surfaces of the inner-layer former 1 and the inner-layer coil 4. Thus the inner-layer former 1 and the inner-layer coil 4 are surrounded continuously by a film of gas. The presence of this film of gas notably reduces the amount of heat diffused into the liquid refrigerant in a short space of time. Thus, such a structure can retard the boiling of refrigerant and lower the quench pressure. The holes can be uniformly distributed on the baffle 6, or the positions and distribution of the holes on the baffle 6 can be determined on the basis of analysis of gas and liquid flow.

Furthermore, in addition to having the inner-layer former 1 and the inner-layer coil 4 covered by the baffle 6, the outer-layer former 2 and outer-layer coil 3 can also be covered by a baffle (not shown), in order to further lower the quench pressure.

In the embodiments of the present invention, the frame 5 connects the inner-layer former 1 and the outer-layer former 2 through bolts. Of course, the method of connecting the frame 5 to the inner-layer former 1 and the outer-layer former 2 is not limited to this; the frame 5 can be connected to the inner-layer former 1 and the outer-layer former 2 by other connecting methods such as bolts, welding, screws or rivets. Alternatively, during manufacture of these components, the frame 5 can be produced integrally with one of the inner-layer former 1 and the outer-layer former 2; the frame 5 can then be connected to the other one of the inner-layer former 1 and the outer-layer former 2 by the above connecting methods.

In the embodiments of the present invention, the inner-layer former 1 and the outer-layer former 2 can be made from aluminium 5083 (AL5083) or aluminium AC4A (AL AC4A), or any other suitable aluminium alloy material.

The superconducting magnet device provided by the embodiments of the present invention is described taking the structure of inner-layer and outer-layer coils and formers as an example. However, the superconducting magnet device is not restricted to a structure of inner-layer and outer-layer coils and formers; for example, a single-layer coil and former structure can be employed.

The embodiments of the present invention also provide a magnetic resonance imaging system comprising the above superconducting magnet device.

Although modifications and changes may be suggested by those skilled in the art, it is the intention of the inventors to embody within the patent warranted hereon all changes and modifications as reasonably and properly come within the scope of their contribution to the art.

We claim as our invention:
1. A superconducting magnet device, comprising:
a first former;
a first coil formed by a superconducting wire wound on the first former;
a cryogen that places said superconducting wire in a superconducting state, with interaction between said superconducting wire and said cryogen producing a gas;
a baffle covering the first former and the first coil, with an open gap between the baffle and the first coil; and
said baffle having a baffle structure that confines said gas in said gap and causes said gas to form a gas film that surrounds said first coil on said first former, that reduces heat diffusion from said superconducting wire to said cryogen.

2. Superconducting magnet device according to claim 1, comprising:
   a second former around the outside of the first former and the first coil;
   a second coil formed by another superconducting wire wound on the second former; and
   a frame between the first former and the second former, that supports the second former and making the second former fixed relative to the first former.

3. Superconducting magnet device according to claim 2, further comprising:
   a further baffle covering the second former and the second coil, with a gap between the further baffle and the second coil.

4. Superconducting magnet device according to claim 3, wherein the further baffle is set with multiple holes.

5. Superconducting magnet device according to claim 4, wherein the multiple holes are distributed on the further baffle uniformly.

6. Superconducting magnet device according to claim 4, wherein the further baffle is a plate made from non-metallic material.

7. Superconducting magnet device according to claim 6, wherein the non-metallic material is glass fiber reinforced plastic.

8. Superconducting magnet device according to claim 2, wherein the frame connects the first former and the second former by bolts, welding, screws or rivets.

9. Superconducting magnet device according to claim 2, wherein the first former and the second former are made from aluminium 5083 or aluminium AC4A or an aluminium alloy.

10. Superconducting magnet device according to claim 1, wherein the baffle is set with multiple holes.

11. Superconducting magnet device according to claim 10, wherein the baffle is a plate made from non-metallic material.

12. Superconducting magnet device according to claim 11, wherein the non-metallic material is glass fiber reinforced plastic.

13. Superconducting magnet device according to claim 10, wherein the multiple holes are distributed on the baffle uniformly.

* * * * *